United States Patent
Charnvanichborikarn et al.

(10) Patent No.: US 11,699,570 B1
(45) Date of Patent: Jul. 11, 2023

(54) SYSTEM AND METHOD FOR HI-PRECISION ION IMPLANTATION

(71) Applicant: Applied Materials, Inc., Santa Clara, CA (US)

(72) Inventors: Supakit Charnvanichborikarn, Gloucester, MA (US); Wei Zou, Lexington, MA (US); Hans-Joachim L. Gossmann, Summit, NJ (US); Qintao Zhang, Mt Kisco, NY (US); Aseem Kumar Srivastava, Andover, MA (US); William Robert Bogiages, Jr., Danvers, MA (US); Wei Zhao, Lexington, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/665,970

(22) Filed: Feb. 7, 2022

(51) Int. Cl.
*H01J 37/317* (2006.01)
*H01J 37/304* (2006.01)

(52) U.S. Cl.
CPC ........ *H01J 37/3171* (2013.01); *H01J 37/304* (2013.01); *H01J 2237/31705* (2013.01)

(58) Field of Classification Search
CPC ................. H01J 37/3171; H01J 37/304; H01J 2237/31705
See application file for complete search history.

(56) References Cited

U.S. PATENT DOCUMENTS

| 7,397,047 | B2 * | 7/2008 | Chang | H01J 37/3171 438/10 |
| 7,709,817 | B2 * | 5/2010 | Burgess | H01J 37/3171 702/199 |
| 9,773,712 | B2 * | 9/2017 | Ito | H01L 22/26 |
| 2005/0092939 | A1 * | 5/2005 | Coss | H01J 37/3171 700/121 |
| 2005/0181524 | A1 * | 8/2005 | Borden | H01J 37/3171 438/14 |
| 2008/0078952 | A1 * | 4/2008 | Gupta | H01J 37/304 250/492.21 |
| 2008/0096359 | A1 * | 4/2008 | Gupta | H01L 22/14 257/E21.531 |

(Continued)

OTHER PUBLICATIONS

Y. Chen, M.F. Morris, B. Obradovic, G. Wang, D. Li, A.F. Tasch, and J.S. Swinnea, "The Impact of Crystal Cut Error on the Measured Impurity Profiles Resulting from Ion Implantation", IEEE Trans. Semicond. Manufacturing 13, 243-248 (2000).

(Continued)

*Primary Examiner* — Sean M Luck
(74) *Attorney, Agent, or Firm* — KDW Firm PLLC

(57) ABSTRACT

A method of performing an ion implantation process using a beam-line ion implanter, including disposing a substrate on a platen, analyzing the substrate using metrology components, communicating data relating to the analysis of the substrate to a feedforward controller, processing the data using a predictive model executed by the feedforward controller to compensate for variations in the substrate and to compensate for variations in components of the beam-line ion implanter based on historical data collected from previous implantation operations, and using output from the predictive model to adjust operational parameters of the beam-line ion implanter.

20 Claims, 2 Drawing Sheets

(56) References Cited

U.S. PATENT DOCUMENTS

2020/0312616 A1* 10/2020 Takemura ........... H01J 37/3171

OTHER PUBLICATIONS

N. Teranishi, G. Fuse, and M. Sugitani, "A Review of Ion Implantation Technology for Image Sensors", 18, 2358 (2018), 17 pages.

G. Luckman, M. Harris, R.D. Rathmell, P. Kopalidis, A.M. Ray, F. Sato, and M. Sano, "Precision Halo Control with Antimony and Indium on Axcelis Medium Current Ion Implanters", Int. Conf. Proc. IIT, 279-282 (2002).

J.H. Park, T.-S. Chang, M. Kim, S. Woo, S Kim, "Suppression of threshold voltage variability in MOSFETs by adjustment of ion implantation parameters", Superlattices and Microstructures 113, 169-177 (2018).

M. Lazar, F. Laariedh, P. Cremillieu, D. Planson, J.-L. Leclercq, "The channeling effect of Al and N ion implantation in 4H—SiC during JFET integrated device processing", Nucl. Instrum. Methods Phys. Res. B, 365, 256-259 (2015).

N. Kuroda, K. Shibahara, W. Yoo, S. Nishino, and H. Matsunami, "Step-Controlled VPE Growth of SiC Single Crystals at Low Temperatures", Extended Abstracts of 19th Conf. Sol. State Devices and Mater., Tokyo, 227-230 (1987).

K. Masumoto, H. Asamizu, K. Tamura, C. Kudou, J. Nishio, K. Kojima, T. Ohno, and H. Okumura, "Suppression of 3C-Inclusion Formation during Growth of 4H—SiC Si-Face Homoepitaxial Layers with a 1° Off-Angle", Materials 7, 7010-7021 (2014).

N. Srivastava, G. He, Luxmi, P.C. Mende, R.M. Feenstra, and Y. Sun, "Graphene formed on SiC under various environments: comparison of Si-face and C-face", J. Phys. D: Appl. Phys. 45, 154001, 13 pages (2012).

C. Dimitrakopoulos, A. Grill, T.J. McArdle, Z. Liu, R. Wisnieff, and D.A. Antoniadis, "Effect of SiC wafter miscut angle an the morphology and Hall mobility of epitaxially grown graphene", Appl. Phys. Lett., 98, 222105, 4 pages (2011).

* cited by examiner

SYSTEM AND METHOD FOR HI-PRECISION ION IMPLANTATION

FIELD OF THE DISCLOSURE

The disclosure relates generally to processing apparatus for semiconductor devices, and more particularly to plasma-based ion sources.

BACKGROUND OF THE DISCLOSURE

Ion implantation is a standard technique for introducing conductivity-altering impurities into a workpiece such as a wafer or other substrate. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

As modern electronic devices become smaller and more complex, the need for high-precision ion implantation is increasing. The precision of ion implantation processes can be adversely affected by numerous factors relating to the characteristics and imperfections of a particular workpiece being processed as well as the characteristics and imperfections of a particular ion implanter being used to perform an implantation process. Such characteristics and imperfections include, and are not limited to, miscuts in the workpiece, warping or misalignment of a platen of the ion implanter, unintended variations in the focus of an ion beam, etc. If unaccounted for, these characteristics and imperfections can be highly determinantal to the quality and efficiency of ion implantation processes and to the quality of resulting products.

With respect to these and other considerations the present disclosure is provided.

BRIEF SUMMARY

This Summary is provided to introduce a selection of concepts in a simplified form. This Summary is not intended to identify key features or essential features of the claimed subject matter, nor is this Summary intended as an aid in determining the scope of the claimed subject matter.

A beam-line ion implanter comprising in accordance with an exemplary embodiment of the present disclosure may include an ion source for generating an ion beam, and an end station including a platen for supporting a substrate to be implanted by the ion beam, a scanner for moving the platen in a controllable manner, and metrology components for analyzing the substrate. The beam-line ion implanter may further include a main controller operatively coupled to the ion source, the scanner, and the metrology components and adapted to control operation of the ion source, the scanner, and the metrology components, and a feedforward controller operatively coupled to the main controller and the metrology components, the feed forward controller adapted to process information received from the metrology components using a predictive model to influence operation of the main controller to compensate for variations in the substrate and to compensate for variations in components of the beam-line ion implanter based on historical data collected from previous implantation operations.

A method of performing an ion implantation process using a beam-line ion implanter in accordance with an exemplary embodiment of the present disclosure may include disposing a substrate on a platen, analyzing the substrate using metrology components, communicating data relating to the analysis of the substrate to a feedforward controller, processing the data using a predictive model executed by the feedforward controller to compensate for variations in the substrate and to compensate for variations in components of the beam-line ion implanter based on historical data collected from previous implantation operations, and using output from the predictive model to adjust operational parameters of the beam-line ion implanter.

A method of performing an ion implantation process using a beam-line ion implanter in accordance with another exemplary embodiment of the present disclosure may include disposing a substrate on a platen, analyzing the substrate using metrology components to determine a crystal orientation of the substrate, communicating data relating to the crystal orientation of the substrate to a feedforward controller, using the data relating to the crystal orientation of the substrate to determine miscut angles in a crystalline structure of the substrate, using the miscut angles to calculate offset angles required to compensate for the miscut angles, using a predictive model executed by the feedforward controller to modify the offset angles to compensate for variations in the substrate and to compensate for variations in components of the beam-line ion implanter based on historical data collected from previous implantation operations, and using output from the predictive model to adjust operational parameters of the beam-line ion implanter.

BRIEF DESCRIPTION OF THE DRAWINGS

The accompanying drawings illustrate exemplary approaches of the present disclosure, including the practical application of the principles thereof, as follows.

Figure 1:
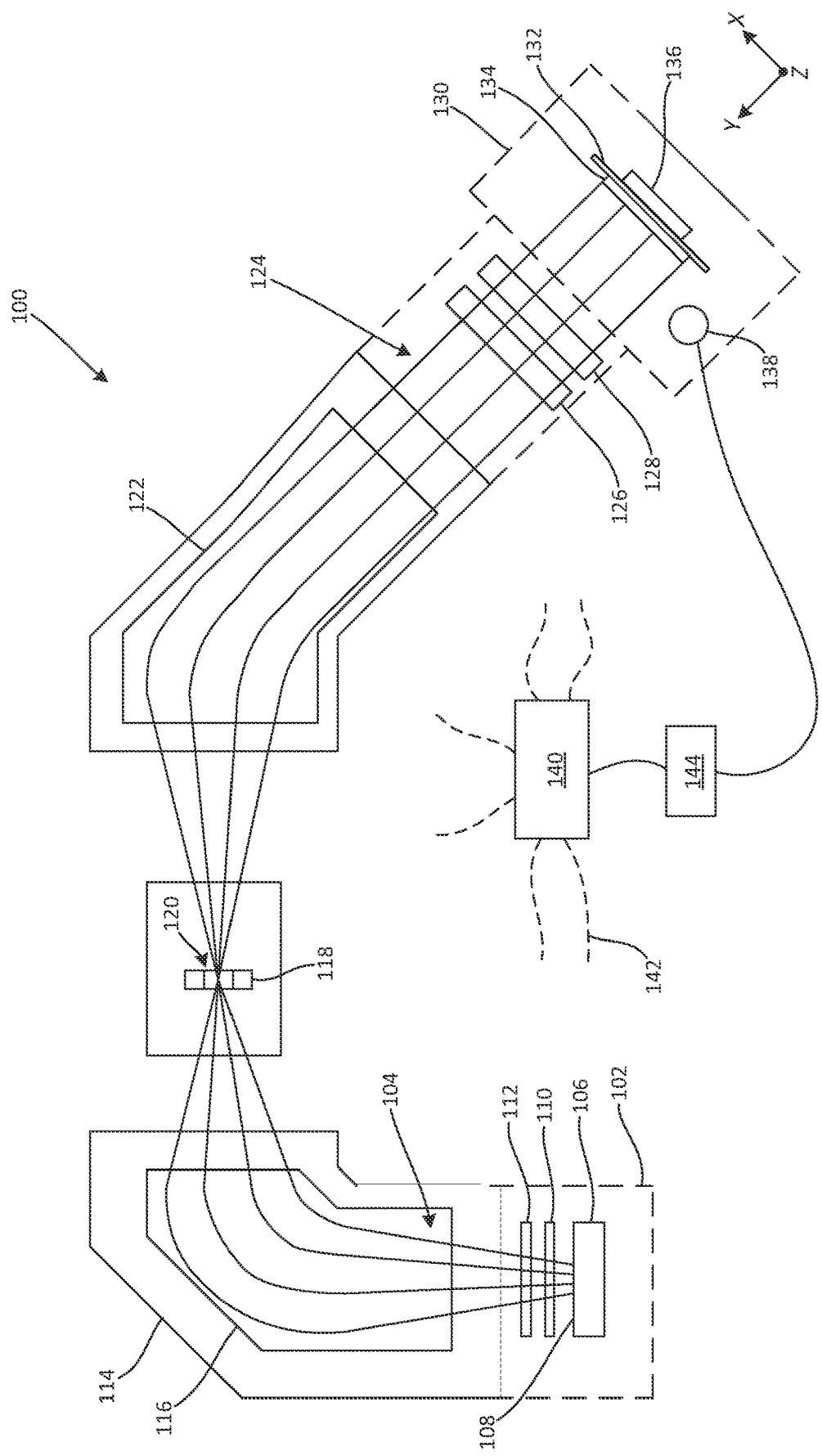
FIG. 1 is a schematic view illustrating an exemplary embodiment of a beam-line ion implanter in accordance with the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

DETAILED DESCRIPTION

A system and method for achieving hi-precision ion implantation in accordance with the present disclosure will now be described more fully hereinafter with reference to the accompanying drawings, wherein embodiments of the system and method are shown. The system and method may be embodied in many different forms and are not to be construed as being limited to the embodiments set forth herein. Instead, these embodiments are provided so this disclosure will convey certain exemplary aspects of the system, and method to those skilled in the art.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

The systems and methods disclosed herein are described in connection with an ion implanter used in the processing of workpieces such as, for example, semiconductor wafers, flat panels, solar cells, light-emitting diodes (LEDs), etc. The present disclosure is not limited in this regard. FIG. 1 is a schematic diagram illustrating an exemplary beam-line ion implanter 100. The beam-line ion implanter 100 is one of many examples of beam-line ion implanters capable of producing and directing ions for processing workpieces. Thus, the systems and methods disclosed herein are not limited to implementation with the beam-line ion implanter 100 of FIG. 1. Various types of ion implanters can be substituted for the ion implanter 100 as may be suitable for a particular application.

In general, the beam-line ion implanter 100 (hereinafter "the implanter 100") may include an ion source 102 adapted to generate ions for forming an ion beam 104. The ion source 102 may include an ion chamber 106 where the ions are produced. The ion species may be, or may include or contain, hydrogen, helium, oxygen, nitrogen, arsenic, boron, phosphorus, aluminum, indium, gallium, antimony, carborane, other rare gases, alkanes, another large molecular compound, or other p-type or n-type dopants. The present disclosure is not limited in this regard. The generated ions may be extracted from the ion chamber 106 by a series of extraction electrodes to form the ion beam 104. In particular, the ions may be extracted from chamber 106 by an extraction electrode 108 (e.g., integral with an exit aperture of the ion chamber 106), a suppression electrode 110, and a ground electrode 112.

The ion beam 104 is mass analyzed by mass analyzer 114 having a resolving magnet 116 and a masking electrode 118 having a resolving aperture 120. The resolving magnet 116 deflects ions in the ion beam 104 to isolate ions having a desired mass-to-charge ratio associated with a particular dopant ion species subsequently allowed to pass through the resolving aperture 120. Undesired ion species are deflected into, and blocked, by the masking electrode 118 and thus do not pass through the resolving aperture 120.

Ions of the desired ion species pass through resolving aperture 120 to an angle corrector magnet 122. The angle corrector magnet 122 deflects ions of the desired ion species and converts the ion beam from a diverging ion beam to a focused ion beam 124 (e.g., a ribbon beam or a spot beam) having generally parallel ion trajectories. The implanter 100 may further include acceleration unit 126 and/or a deceleration unit 128. The acceleration and deceleration units 126, 128 may be used to speed up or slow down the focused ion beam 124. Speed adjustment is accomplished by applying specific combinations of voltage potentials to sets of electrodes disposed on opposite sides of the focused ion beam 124. As the focused ion beam 124 passes between the electrodes, ion energies are increased or decreased depending on the applied voltage potentials. Since the depth of an ion implant is proportional to the energy of the impinging ion beam, beam acceleration may be desirable when performing deep ion implants. Conversely, where shallow ion implants are desired, beam deceleration is performed to ensure the impinging ions travel only a short distance into the workpiece.

An end station 130 of the implanter 100 may include a platen 132 configured to support one or more workpieces, such as substrate 134. The substrate 134 may be disposed in the path of the focused ion beam 124 and ions of the desired ion species may be implanted into the substrate 134. The substrate 134 may be, for example, a semiconductor wafer, solar cell, etc. The end station 130 may include a scanner 136 adapted to move the platen 132 and the substrate 134 perpendicular to the long dimension of the focused ion beam 124 (i.e., along the X-axis of the illustrated Cartesian coordinate system) for distributing ions over the entire surface of the substrate 134. The scanner 136 may further be adapted to move the platen 132 and the substrate 134 parallel to the long dimension of the focused ion beam 124 (i.e., along the Y-axis of the illustrated Cartesian coordinate system). The scanner 136 may further be adapted to tilt or rotate the platen 132 and the substrate 134 relative to the focused ion beam 124 (e.g., rotate the platen 132 and the substrate 134 about the Y-axis of the illustrated Cartesian coordinate system). The present disclosure is not limited in this regard. The implanter 100 may include additional components known to those skilled in the art and may incorporate hot or cold implantation of ions in some embodiments.

The implanter 100 may further include one or more metrology components 138. The metrology components 138 may include, and are not limited to, an ellipsometer, a reflectometer, a pyrometer, an X-ray diffractometer, etc. The metrology components 138 may facilitate the analysis/measurement of various aspects, features, and characteristics of the substrate 134 before and after ion beam processing is performed. For example, the metrology components 138 may be used to analyze the crystal orientation of the substrate 134 prior to processing as further described below. In another example, the metrology components 138 may be used to analyze/measure the depth, profile, quality, etc. of an implantation after processing as further described below. The present disclosure is not limited in this regard.

The implanter 100 may further include a main controller 140 operatively coupled to one or more of the ion source 102, the mass analyzer 114, the angle corrector magnet 122, the acceleration unit 126, the deceleration unit 128, the scanner 136, the metrology components 138, etc., by various data lines (as indicated by the dashed lines 142) for controlling and coordinating the operation of the aforementioned components. The main controller 140 may include a processor, such as a known type of microprocessor, dedicated semiconductor processor chip, general purpose semiconductor processor chip, or similar device. The main controller 140 may further include a memory or memory unit coupled to the processor, where the memory unit contains a control routine for controlling the operation of the components of the implanter 100 in a predetermined manner based on various inputs as further described below.

The memory unit of the main controller 140 may comprise an article of manufacture. In one embodiment, the memory unit may comprise any non-transitory computer readable medium or machine readable medium, such as an optical, magnetic or semiconductor storage. The storage medium may store various types of computer executable instructions to implement one or more of logic flows described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

The implanter 100 may further include a feedforward controller 144 operatively coupled to the metrology components 138 and to the main controller 140. As described in greater detail below, the feedforward controller 144 may be adapted to receive information from the metrology components 138 and to influence the main controller 140 to operate various components of the implanter 100 to improve the precision and efficiency of implantation processes performed by the implanter 100. For example, prior to implantation of the substrate 134, the feedforward controller 144 may receive X-ray diffraction measurements of the substrate 134 from the metrology components 138 and may use such measurements to determine miscut angles in the crystalline structure of the substrate 134.

The feedforward controller 144 may use the miscut angles to calculate angular offsets ("offset angles") required to compensate for such miscut angles during implantation, such as may be achieved by tilting, shifting, or rotating the platen 132 and the substrate 134 using the scanner 136. The feedforward controller 144 may then modify the calculated offset angles using a predictive model, wherein historical data relating to the performance of the implanter 100, as determined by measurements taken after previous implantation processes, may be used to adjust the offset angles to compensate for unintended variations or imperfections in the implanter 100. Such variations or imperfections may include, and are not limited to, misalignment of the platen 132, unevenness or warping in the surface of the platen 132, variations in the focus of the focused ion beam 124, etc. The modified offset angles generated by the predictive model may then be communicated to the main controller 140 to influence the operation of the implanter 100 to account for the variations and imperfections in the substrate 134 and in the implanter 100 to achieve high precision implantation. For example, the main controller 140 may tilt, shift, or rotate the platen 132 and the substrate 134 via the scanner 136, may accelerate or decelerate the focused ion beam 124 via the acceleration unit 126 or the deceleration unit 128, etc. The present disclosure is not limited in this regard. The method of operating the feedforward controller 144 will be described in greater detail below.

Like the main controller 140, the feedforward controller 144 may include a processor, such as a known type of microprocessor, dedicated semiconductor processor chip, general purpose semiconductor processor chip, or similar device. The feedforward controller 144 may further include a memory or memory unit coupled to the processor. The memory unit of the feedforward controller 144 may comprise an article of manufacture. In one embodiment, the memory unit may comprise any non-transitory computer readable medium or machine readable medium, such as an optical, magnetic or semiconductor storage. The storage medium may store various types of computer executable instructions to implement one or more of logic flows described herein (e.g., the predictive model described below). Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

Figure 2:
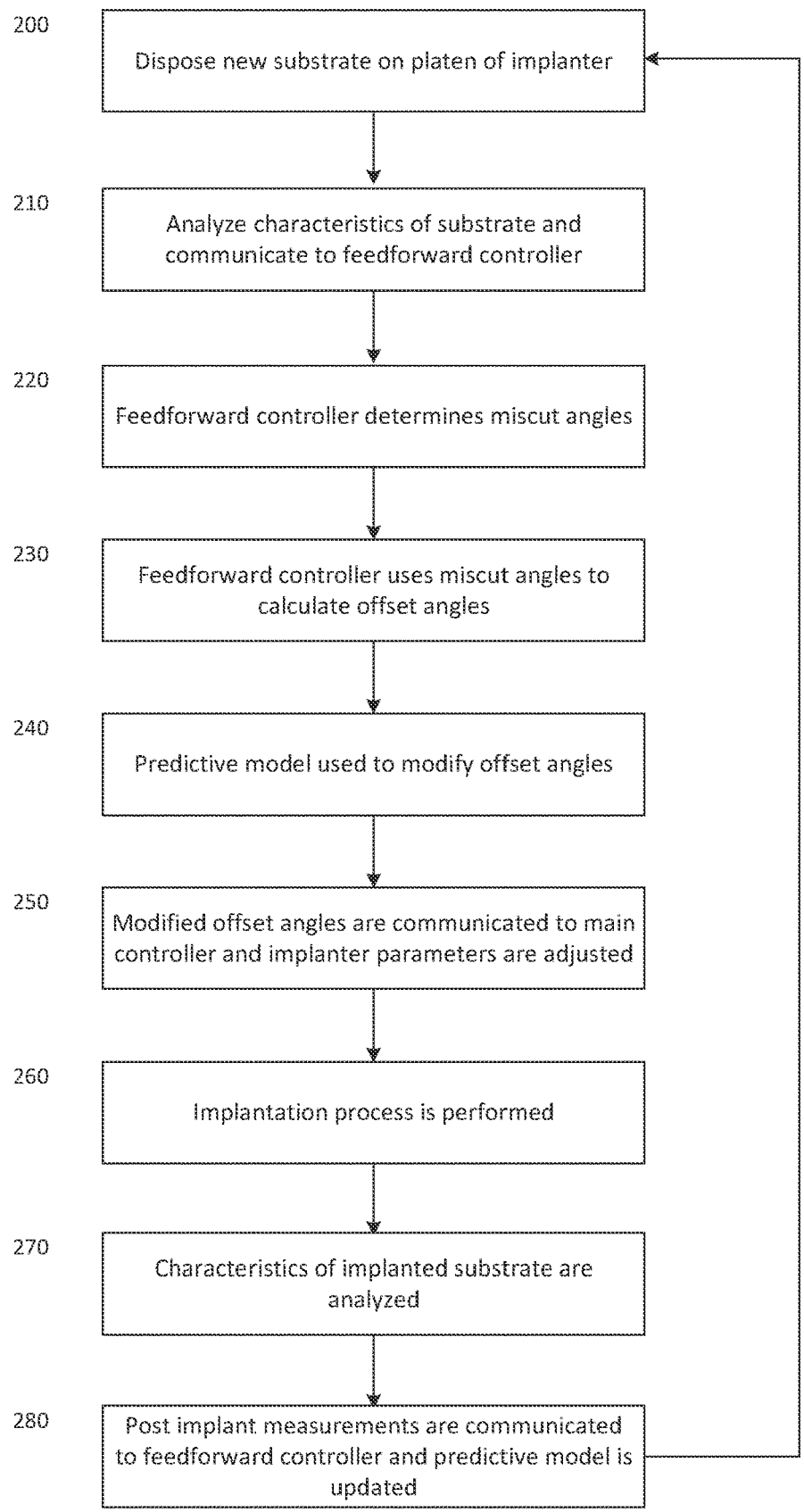
FIG. 2 is a block diagram illustrating an exemplary embodiment of a method of operating the beam-line ion implanter shown in FIG. 1.

Referring to FIG. 2, a flow diagram illustrating an exemplary method for operating the implanter 100 to perform an implantation process on the substrate 134 is shown. The method will now be described in conjunction with the illustration of the implanter 100 shown in FIG. 1.

At block 200 of the exemplary method, the substrate 134 may be disposed on the platen 132 of the implanter 100. In various embodiments, the substrate 134 may be secured to the platen 132 via electrostatic clamping, mechanical clamping, etc. The present disclosure is not limited in this regard. At block 210 of the method, the metrology components 138 may be employed to analyze various characteristics of the substrate 134 and to communicate data relating to such analysis to the feedforward controller 144. For example, the metrology components 138 may obtain X-ray diffraction measurements of the substrate 134 and may communicate information relating to the crystal orientation of the substrate 134 to the feedforward controller 144. Various other types of information relating to the characteristics of the substrate 134 may additionally or alternatively be analyzed or measured by the metrology components 138 and communicated to the feedforward controller 144.

At block 220 of the exemplary method, the feedforward controller 144 may use data received from the metrology components 138 (e.g., information relating to the crystal orientation of the substrate 134) to determine miscut angles in the crystalline structure of the substrate 134. As will be appreciated by those of ordinary skill in the art, miscut angles can lead to undesirable deviations in implant angles if unaccounted for. At block 230 of the method, the feedforward controller 144 may use the miscut angles to calculate offset angles required to compensate for the miscut angles during implantation. For example, the calculated offset angles may represent the manner and the degree the platen 132 and the substrate 134 need to be shifted, tilted, and/or rotated to compensate for the miscut angles and achieve a properly aligned implant.

At block 240 of the exemplary method, the feedforward controller 144 may employ a predictive model (also referred to as predictive analytics) to modify the offset angles calculated in block 230 to compensate for unintended variations or imperfections in the implanter 100. For example, the predictive model may use data from many previous implantation processes to predict, and account for, the way the specific, contemporaneous characteristics of the implanter 100 will affect the implantation of the substrate 134. Such characteristics may include, and are not limited to, misalignment of the platen 132, unevenness or warping in the surface of the platen 132, variations in the focus of the focused ion beam 124, etc. These characteristics may change over time due to variations in factors such as temperature, humidity, pressure, normal wear, etc. In various examples, the predictive model may be, or may include, a machine learning algorithm stored in the memory of the feedforward controller 144 and executed by the processor of the feedforward controller 144.

At block 250 of the exemplary method, the modified offset angles generated by the predictive model may be communicated to the main controller 144 to influence the operation of the implanter 100 (e.g., to adjust various operational parameters of the implanter 100) to account for the variations and imperfections in the substrate 134 and in the implanter 100 to achieve high precision (e.g., precisely aligned) implantation. For example, the main controller 140 may employ the scanner 136 to tilt, shift, or rotate the platen 132 and the substrate 134, may employ the acceleration unit 126 or the deceleration unit 128 to accelerate or decelerate the focused ion beam 124, etc. The present disclosure is not limited in this regard. After such adjustments have been made, the implanter 100 may, at block 260 of the method, perform an implantation process on the substrate 134.

At block 270 of the exemplary method, after the implantation process of block 150 has been completed, the metrology components 138 may be employed to analyze the characteristics of the implanted substrate 134 to determine the quality of the implant (e.g., to determine whether the substrate 134 has been implanted in the expected manner). In various examples, such measurements may relate to the profile of the implant. The present disclosure is not limited in this regard. At block 280 of the method, the post-implantation measurements taken obtained by the metrology components 138 may be communicated to the feedforward controller 144 and may be used to update/enhance the predictive model for use in future implantation processes.

In view of the above, the embodiments of the present disclosure provide at least the following advantages. As a first advantage, from an equipment and process point of view, the present embodiments facilitate highly precise ion implantation wherein the variations and imperfections in a particular substrate and in a particular ion implanter can be accounted for. As a second advantage, from a material modification point of view, the precision implantation facilitated by the embodiments of the present disclosure allow, for example, channeling implantation to achieve a desired doping profile with controllable implant damage.

While certain embodiments of the disclosure have been described herein, the disclosure is not limited thereto, as the disclosure is as broad in scope as the art will allow and the specification may be read likewise. Therefore, the above description is not to be construed as limiting. Those skilled in the art will envision other modifications within the scope and spirit of the claims appended hereto.

The invention claimed is:

1. A beam-line ion implanter comprising:
an ion source for generating an ion beam;
an end station comprising:
a platen for supporting a substrate to be implanted by the ion beam;
a scanner for moving the platen in a controllable manner; and
metrology components for analyzing the substrate;
a main controller operatively coupled to the ion source, the scanner, and the metrology components and adapted to control operation of the ion source, the scanner, and the metrology components; and
a feedforward controller operatively coupled to the main controller and the metrology components, the feedforward controller adapted to process information received from the metrology components using a predictive model to influence operation of the main controller to compensate for variations in the substrate and to compensate for variations in components of the beam-line ion implanter based on historical data collected from previous implantation operations.

2. The beam-line ion implanter of claim 1, wherein the metrology components include an X-ray diffractometer for analyzing a crystal orientation of the substrate.

3. The beam-line ion implanter of claim 2, wherein the feedforward controller is adapted to receive information relating to the crystal orientation of the substrate and to determine miscut angles in a crystalline structure of the substrate therefrom.

4. The beam-line ion implanter of claim 3, wherein the feedforward controller is adapted to use the miscut angles to calculate offset angles required to compensate for the miscut angles during implantation of the substrate.

5. The beam-line ion implanter of claim 4, wherein the feedforward controller is adapted to modify the offset angles using the predictive model to compensate for variations in components of the beam-line ion implanter based on historical data collected from previous implantation operations.

6. The beam-line ion implanter of claim 1, wherein the feedforward controller comprises a memory for storing the predictive model and a processer for executing the predictive model.

7. The beam-line ion implanter of claim 1, wherein the main controller is adapted to cause the scanner to rotate, tilt, or shift the platen in response to data received from the feedforward controller.

8. The beam-line ion implanter of claim 1, further comprising an acceleration unit for accelerating the ion beam, wherein the main controller is adapted to cause the acceleration unit to accelerate the ion beam in response to data received from the feedforward controller.

9. The beam-line ion implanter of claim 1, further comprising a deceleration unit for decelerating the ion beam, wherein the main controller is adapted to cause the deceleration unit to decelerate the ion in response to data received from the feedforward controller.

10. A method of performing an ion implantation process using a beam-line ion implanter, the method comprising:
disposing a substrate on a platen;
analyzing the substrate using metrology components;
communicating data relating to the analysis of the substrate to a feedforward controller;
processing the data using a predictive model executed by the feedforward controller to compensate for variations in the substrate and to compensate for variations in components of the beam-line ion implanter based on historical data collected from previous implantation operations; and
using output from the predictive model to adjust operational parameters of the beam-line ion implanter.

11. The method of claim 10, wherein analyzing the substrate includes determining a crystal orientation of the substrate.

12. The method of claim 11, further including using data relating to the crystal orientation of the substrate to determine miscut angles in a crystalline structure of the substrate.

13. The method of claim 12, further including using the miscut angles to calculate offset angles required to compensate for the miscut angles.

14. The method of claim 13, wherein using the output from the predictive model to adjust operational parameters of the beam-line ion implanter includes communicating offset angles modified by the predictive model to a main controller of the beam-line ion implanter.

15. The method of claim 10, wherein adjusting operational parameters of the beam-line ion implanter includes manipulating a scanner to move the platen of the beam-line ion implanter.

16. The method of claim 10, wherein adjusting operational parameters of the beam-line ion implanter includes manipulating a deceleration unit to decelerate an ion beam produced by the beam-line ion implanter.

17. The method of claim 10, wherein adjusting operational parameters of the beam-line ion implanter includes manipulating an acceleration unit to accelerate an ion beam produced by the beam-line ion implanter.

18. The method of claim 10, further comprising using the metrology components to analyze, after the substrate has been implanted, characteristics of the implanted substrate to determine a quality of the implant.

19. The method of claim 18, further comprising communicating data relating to the analysis of the implanted substrate to the feedforward controller and using such data to update the predictive model.

20. A method of performing an ion implantation process using a beam-line ion implanter, the method comprising:
  disposing a substrate on a platen;
  analyzing the substrate using metrology components to determine a crystal orientation of the substrate;
  communicating data relating to the crystal orientation of the substrate to a feedforward controller;
  using the data relating to the crystal orientation of the substrate to determine miscut angles in a crystalline structure of the substrate;
  using the miscut angles to calculate offset angles required to compensate for the miscut angles;
  using a predictive model executed by the feedforward controller to modify the offset angles to compensate for variations in the substrate and to compensate for variations in components of the beam-line ion implanter based on historical data collected from previous implantation operations; and
  using output from the predictive model to adjust operational parameters of the beam-line ion implanter.

* * * * *